(12) United States Patent
Ganiger et al.

(10) Patent No.: US 12,110,805 B2
(45) Date of Patent: Oct. 8, 2024

(54) FAN BLADE WITH INTRINSIC DAMPING CHARACTERISTICS

(71) Applicant: General Electric Company, Schenectady, NY (US)

(72) Inventors: Ravindra Shankar Ganiger, Bengaluru (IN); Viswanadha Gupta Sakala, Bengaluru (IN); Nicholas Joseph Kray, West Chester, OH (US); Ambika Shivamurthy, Bengaluru (IN); Kirti Arvind Petkar, Bengaluru (IN)

(73) Assignee: General Electric Company, Evendale, OH (US)

( * ) Notice: Subject to any disclaimer, the term of this patent is extended or adjusted under 35 U.S.C. 154(b) by 0 days.

(21) Appl. No.: 18/329,467

(22) Filed: Jun. 5, 2023

(65) Prior Publication Data

US 2023/0313688 A1  Oct. 5, 2023

Related U.S. Application Data

(63) Continuation of application No. 17/844,578, filed on Jun. 20, 2022, now Pat. No. 11,702,940, which is a (Continued)

(30) Foreign Application Priority Data

May 25, 2020  (IN) .............................. 202011021818

(51) Int. Cl.
*F01D 5/02* (2006.01)
*F01D 5/14* (2006.01)
*G06F 30/17* (2020.01)

(52) U.S. Cl.
CPC .............. *F01D 5/147* (2013.01); *F01D 5/02* (2013.01); *G06F 30/17* (2020.01); (Continued)

(58) Field of Classification Search
CPC ........ F01D 5/147; F01D 5/02; F05D 2220/32; F05D 2230/80; F05D 2240/24
See application file for complete search history.

(56) References Cited

U.S. PATENT DOCUMENTS 2,642,263 A  6/1953  Thorp, II
2,873,944 A  2/1959  Wiese et al.
(Continued)

FOREIGN PATENT DOCUMENTS

CN  109210000 A  1/2019

OTHER PUBLICATIONS

United States Patent and Trademark Office, "Non-Final Office Action," issued in connection with U.S. Appl. No. 16/923,911, dated Sep. 1, 2021, 8 pages.
(Continued)

*Primary Examiner* — David E Sosnowski
*Assistant Examiner* — Theodore C Ribadeneyra
(74) *Attorney, Agent, or Firm* — HANLEY, FLIGHT & ZIMMERMAN, LLC

(57) ABSTRACT

Methods, apparatus, systems and articles of manufacture corresponding to a fan blade with intrinsic damping characteristics are disclosed. An example fan blade comprises an exterior body including a first side and a second side; a first hairpin structure in contact with (a) the first side of the exterior body and (b) the second side of the exterior body; and a second hairpin structure in contact with (a) the first side and (b) the second side, wherein the first hairpin structure corresponds to a first stiffness and the second hairpin structure corresponds to a second stiffness different than the first stiffness.

14 Claims, 9 Drawing Sheets

Related U.S. Application Data continuation of application No. 16/923,911, filed on Jul. 8, 2020, now Pat. No. 11,365,636.

(52) U.S. Cl.
CPC ...... *F05D 2220/32* (2013.01); *F05D 2230/80* (2013.01); *F05D 2240/24* (2013.01)

(56) References Cited

U.S. PATENT DOCUMENTS

| | | | |
|---|---|---|---|
| 2,921,769 A | | 1/1960 | Flader |
| 3,095,180 A | | 6/1963 | Clarke et al. |
| 3,369,792 A | * | 2/1968 | Kraimer ................. F01D 5/188 |
| | | | 415/115 |
| 3,606,580 A | | 9/1971 | Kaufman, Sr. |
| 5,056,738 A | | 10/1991 | Mercer et al. |
| 5,284,011 A | | 2/1994 | Von Benken |
| 5,384,959 A | | 1/1995 | Velicki |
| 5,498,137 A | | 3/1996 | El-Aini et al. |
| 6,431,837 B1 | | 8/2002 | Velicki |
| 6,524,074 B2 | | 2/2003 | Farrar et al. |
| 6,607,359 B2 | | 8/2003 | von Flotow |
| 6,676,380 B2 | | 1/2004 | Davis et al. |
| 6,796,408 B2 | | 9/2004 | Sherwin et al. |
| 7,025,568 B2 | | 4/2006 | Jones |
| 7,128,536 B2 | | 10/2006 | Williams et al. |
| 7,347,664 B2 | | 3/2008 | Kayser et al. |
| 7,753,654 B2 | | 7/2010 | Read et al. |
| 7,931,443 B1 | | 4/2011 | Potter et al. |
| 7,955,054 B2 | | 6/2011 | El-Aini et al. |
| 8,292,583 B2 | | 10/2012 | Marra |
| 8,763,360 B2 | | 7/2014 | Murdock |
| 8,974,884 B2 | | 3/2015 | Fabre et al. |
| 9,488,066 B2 | | 11/2016 | Yamashita et al. |
| 9,840,916 B2 | | 12/2017 | Stiehler et al. |
| 9,902,142 B2 | | 2/2018 | Fabre et al. |
| 10,301,948 B2 | | 5/2019 | Wilber |
| 10,329,925 B2 | | 6/2019 | Voleti et al. |
| 10,544,682 B2 | * | 1/2020 | Spangler ................. F01D 25/12 |
| 11,365,636 B2 | | 6/2022 | Ganiger et al. |
| 2004/0151585 A1 | | 8/2004 | Jones |
| 2004/0253115 A1 | | 12/2004 | Williams et al. |
| 2007/0110583 A1 | | 5/2007 | McMillan |
| 2009/0057488 A1 | | 3/2009 | Goldfinch et al. |
| 2010/0329847 A1 | | 12/2010 | Yamashita et al. |
| 2013/0111907 A1 | | 5/2013 | Murdock |
| 2017/0370376 A1 | | 12/2017 | Kray et al. |
| 2019/0048726 A1 | | 2/2019 | Spangler |
| 2021/0363888 A1 | | 11/2021 | Ganiger et al. |

OTHER PUBLICATIONS

United States Patent and Trademark Office, "Notice of Allowance and Fee(s) Due," issued in connection with U.S. Appl. No. 16/923,911, dated Feb. 15, 2022, 9 pages.

United States Patent and Trademark Office, "Corrected Notice of Allowability," issued in connection with U.S. Appl. No. 16/923,911, dated Mar. 3, 2022, 2 pages.

United States Patent and Trademark Office, "Requirement for Restriction," issued in connection with U.S. Appl. No. 16/923,911, dated May 11, 20211, 6 pages.

Nited States Patent and Trademark Office, "Notice of Allowance and Fee(s) Due," issued in connection with U.S. Appl. No. 17/844,578, dated Mar. 1, 2023, 8 pages.

The State Intellectual Property Office of People's Republic of China, "First Office Action and First Search," issued in connection with Chinese Patent Application No. 202110541784.9, dated Jun. 21, 2024, 14 pages. [English Translation Included].

* cited by examiner

FAN BLADE WITH INTRINSIC DAMPING CHARACTERISTICS

RELATED APPLICATIONS

This patent arises from a continuation of U.S. patent application Ser. No. 17/844,578 (now U.S. Pat. No. 11,702, 940), which was filed on Jun. 20, 2022, which is a continuation of U.S. patent application Ser. No. 16/923,911 (now U.S. Pat. No. 11,365,636), which was filed on Jul. 8, 2020, which claims priority to Indian Provisional Patent Application No. 202011021818, which was filed on May 25, 2020. U.S. patent application Ser. No. 17/844,578, U.S. patent application Ser. No. 16/923,911, and Indian Provisional Patent Application No. 202011021818 are hereby incorporated herein by reference in their entireties. Priority to U.S. patent application Ser. No. 17/844,578, U.S. patent application Ser. No. 16/923,911, and Indian Provisional Patent Application No. 202011021818 is hereby claimed.

FIELD OF THE DISCLOSURE

This disclosure relates generally to turbine engines and, more particularly, to a fan blade with intrinsic damping characteristics.

BACKGROUND

In recent years, turbine engines have been increasingly utilized in a variety of applications and fields. Turbine engines are intricate machines with extensive availability, reliability, and serviceability requirements. Turbine engines include fan blades. The fan blades spin at high speed and subsequently compress the air flow. The high-pressure compressor then feeds the pressurized air flow to a combustion chamber to generate a high-temperature, high-pressure gas stream.

BRIEF SUMMARY

Methods, apparatus, systems, and articles of manufacture corresponding to a fan blade with intrinsic damping characteristics are disclosed.

Certain examples provide an example fan blade comprising an exterior body including a first side and a second side. The example fan blade further includes a first hairpin structure coupled to the first side of the exterior body and the second side of the exterior body. The example fan blade further includes a second hairpin structure coupled to the first side and the second side, the first hairpin structure in contact with the second hairpin structure.

Certain examples provide an example turbine engine comprising a compressor, a turbine, and a rotor including a fan blade, the fan blade including a first hairpin structure coupled to a first side of a first interior wall of the fan blade and a second side of a second interior wall of the fan blade.

Certain examples provide method to design a fan blade, the method comprising generating a design of a fan blade to include a first hairpin structure and a second hairpin structure, the first hairpin structure and the second hairpin structure corresponding to test results. The example method further includes fusing the first hairpin structure to a first interior side and a second interior side of the fan blade, the first hairpin structure and the second hairpin structure touching within an interior of the fan blade; and the example method further includes attaching the fan blade to a rotor.

Figure 1:
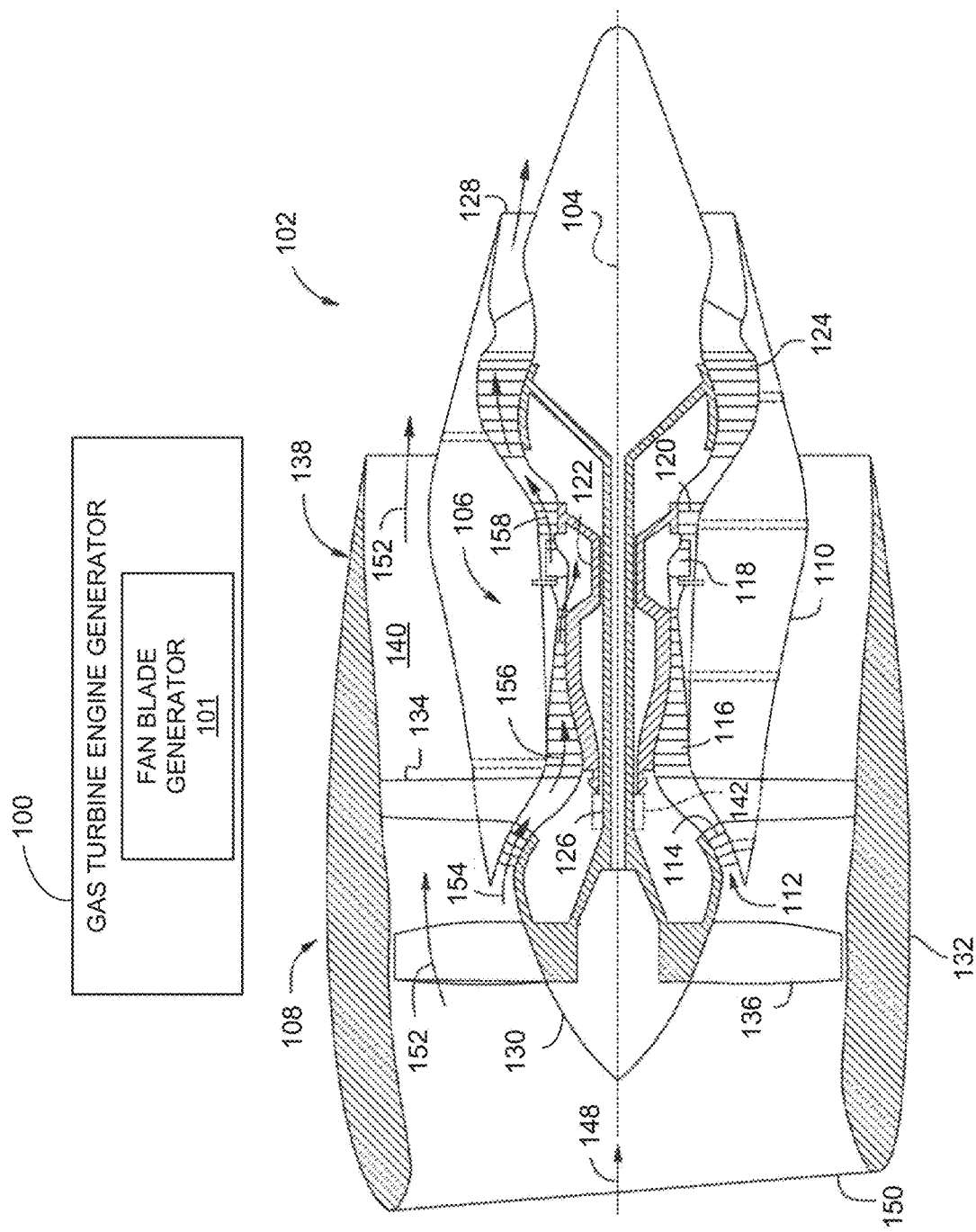
FIG. 1 illustrates an example gas turbine engine that can be utilized within an aircraft in which the examples disclosed herein can be implemented.

The figures are not to scale. Instead, the thickness of the layers or regions may be enlarged in the drawings. In general, the same reference numbers will be used throughout the drawing(s) and accompanying written description to refer to the same or like parts. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other. Stating that any part is in "contact" with another part means that there is no intermediate part between the two parts. Although the figures show layers and regions with clean lines and boundaries, some or all of these lines and/or boundaries may be idealized. In reality, the boundaries and/or lines may be unobservable, blended, and/or irregular.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized. The following detailed description is therefore, provided to describe an exemplary implementation and not to be taken limiting on the scope of the subject matter described in this disclosure. Certain features from different aspects of the following description may be combined to form yet new aspects of the subject matter discussed below.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

As used herein, the terms "system," "unit," "module," "engine," "component," etc., may include a hardware and/or software system that operates to perform one or more functions. For example, a module, unit, or system may include a computer processor, controller, and/or other logic-based device that performs operations based on instructions stored on a tangible and non-transitory computer readable storage medium, such as a computer memory. Alternatively, a module, unit, or system may include a hard-wires device that performs operations based on hard-wired logic of the device. Various modules, units, engines, and/or systems shown in the attached figures may represent the hardware that operates based on software or hardwired instructions, the software that directs hardware to perform the operations, or a combination thereof.

A turbine engine, also called a combustion turbine or a gas turbine, is a type of internal combustion engine. Turbine engines are commonly utilized in aircraft and power-generation applications. As used herein, the terms "asset," "aircraft turbine engine," "gas turbine," "land-based turbine engine," and "turbine engine" are used interchangeably. A basic operation of the turbine engine includes an intake of fresh atmospheric air flow through the front of the turbine engine with a fan. In some examples, the air flow travels through an intermediate-pressure compressor or a booster compressor located between the fan and a high-pressure compressor. The booster compressor is used to supercharge or boost the pressure of the air flow prior to the air flow entering the high-pressure compressor. The air flow can then travel through the high-pressure compressor that further pressurizes the air flow. The high-pressure compressor includes a group of blades (e.g., fans) attached to a shaft. The blades spin at high speed and subsequently compress the air flow. The high-pressure compressor then feeds the pressurized air flow to a combustion chamber. In some examples, the high-pressure compressor feeds the pressurized air flow at speeds of hundreds of miles per hour. In some instances, the combustion chamber includes one or more rings of fuel injectors that inject a steady stream of fuel into the combustion chamber, where the fuel mixes with the pressurized air flow.

In the combustion chamber of the turbine engine, the fuel is ignited with an electric spark provided by an igniter, where the fuel, in some examples, burns at temperatures of more than 2000 degrees Fahrenheit. The resulting combustion produces a high-temperature, high-pressure gas stream (e.g., hot combustion gas) that passes through another group of blades called a turbine. In some examples, a turbine includes an intricate array of alternating rotating and stationary airfoil-section blades. Alternatively, the turbine may be structured with adjacent rotating or stationary airfoil section blades, or in any combination of alternating or adjacent airfoil-section blades. As the hot combustion gas passes through the turbine, the hot combustion gas expands, causing the rotating blades to spin. The rotating blades serve at least two purposes. A first purpose of the rotating blades is to drive the booster compressor and/or the high-pressure compressor to draw more pressured air into the combustion chamber. For example, the turbine is attached to the same shaft as the high-pressure compressor in a direct-drive configuration, thus, the spinning of the turbine causes the high-pressure compressor to spin. A second purpose of the rotating blades is to spin a generator operatively coupled to the turbine section to produce electricity. For example, the turbine can generate electricity to be used by an aircraft, a power station, etc.

In the example of an aircraft turbine engine, after passing through the turbine, the hot combustion gas exits the aircraft turbine engine through a nozzle at the back of the aircraft turbine engine. As the hot combustion gas exits the nozzle, the aircraft turbine engine and the corresponding aircraft coupled to the aircraft turbine engine are accelerated forward (e.g., thrusted forward). In the example of a land-based turbine engine, after passing through the turbine, the hot combustion gas is dissipated, used to generate steam, etc.

In conventional engines, the fan blades, airfoils, and vanes are sized for fan blade out and/or bird strike conditions. However, such conventional fan blades are heavy and complex. Examples disclosed herein include a self-damping aero foil structure with vibration damping and hairpin relative movement (e.g., frictional damping). Disclosed examples include an internal air cavity and/or super elastic material cavity that absorbs an initial impact as well as a one or more layers of sandwiched hairpin structures made of functionally graded material (FGM) filaments or shape memory alloy (SMA) to tailor load capability during high energy events (e.g., a high impact load such as when an object comes into contact with the fan). The example fan blade disclosed herein is thinner and weighs significantly less than conventional fan blades, while also providing a self-damping mechanism to reduce stress on the fan blade.

FIG. 1 is a schematic illustration of an example gas turbine engine generator 100 to generate the example gas turbine engine 102. The example gas turbine engine generator 100 includes an example fan blade generator 101. The example gas turbine engine 102 includes an example core gas turbine engine 106, an example fan section 108, an example outer casing 110, an example annular inlet 112, an example booster compressor 114, an example high-pressure, multi-stage, axial-flow compressor 116, an example combustor 118, a first example turbine 120, a first example drive shaft 122, a second example turbine 124, a second example drive shaft 126, an example exhaust nozzle 128, an example axial-flow fan rotor assembly 130, an example annular fan casing 132, example guide vanes 134, example fan rotor blades 136, an example downstream section 138, an example airflow conduit 140, an example speed reduction device 142, an example inlet 150, and example combustion products 158.

FIG. 1 is a cross-sectional view of the engine 102 that can be utilized within an aircraft in accordance with aspects of the disclosed examples. The gas turbine engine 102 is shown having a longitudinal or axial centerline axis 104 extending throughout the gas turbine engine 102 for reference purposes. As used herein, the terms "axial" and "longitudinal" both refer to a direction parallel to the centerline axis 104, while "radial" refers to a direction perpendicular to the axial direction, and "tangential" or "circumferential" refers to a direction mutually perpendicular to the axial and radial directions. As used herein, the terms "forward" or "front" refer to a location relatively upstream in an air flow passing through or around a component, and the terms "aft" or "rear" refer to a location relatively downstream in an air flow passing through or around a component. The direction of this flow is shown by an arrow 148 in FIG. 1. These directional terms are used merely for convenience in description and do not require a particular orientation of the structures described thereby.

The example gas turbine engine generator 100 of FIG. 1 can include hardware, software, firmware, robots, machines, etc. structured to generate the example engine 102 of FIG. 1. For example, the gas turbine engine generator 100 can generate engine design, test engine designs, and/or generate the example engine 102 based on the generated and/or tested engine design. The example gas turbine engine generator 100 includes an example fan blade generator 101 to generate a design for a self-damping and/or self-shock absorbing fan blade to implement the example fan blade 136. As further described below in conjunction with FIGS. 3-5, the interior of the fan blade 136 can include different hairpin structures designed in various patterns to facilitate shock absorption (e.g., from a high impact event) and/or vibration damping. The example fan blade generator 101 is further described below in conjunction with FIG. 7.

The engine 102 of FIG. 1 includes the core gas turbine engine 106 and the fan section 108 positioned upstream thereof. The core gas turbine engine 106 can generally include the substantially tubular outer casing 110 that defines an annular inlet 112. In addition, the outer casing 110 can further enclose and support the booster compressor 114 for increasing the pressure of the air that enters the core gas turbine engine 106 to a first pressure level. The high-pressure, multi-stage, axial-flow compressor 116 can then receive the pressurized air from the booster compressor 114 and further increase the pressure of such air to a second pressure level. Alternatively, the high-pressure, multi-stage compressor 116 can be a high-pressure, multi-stage centrifugal compressor or a high-pressure, multi-stage axial-centrifugal compressor.

In the illustrated example of FIG. 1, the pressurized air exiting the high-pressure compressor 116 can then flow to the combustor 118 within which fuel is injected into the flow of pressurized air, with the resulting mixture being combusted within the combustor 118. The high-energy combustion products are directed from the combustor 118 along the hot gas path of the engine 102 to the first (high-pressure) turbine 120 for driving the high-pressure compressor 116 via the first (high-pressure) drive shaft 122, and then to the second (low-pressure) turbine 124 for driving the booster compressor 114 and fan section 108 via the second (low-pressure) drive shaft 126 that is generally coaxial with first drive shaft 122. After driving each of the turbines 120 and 124, the combustion products can be expelled from the core gas turbine engine 106 via the exhaust nozzle 128 to provide propulsive jet thrust.

In some examples, each of the compressors 114, 116 can include a plurality of compressor stages, with each stage including both an annular array of stationary compressor vanes and an annular array of rotating compressor blades positioned immediately downstream of the compressor vanes. Similarly, each of the turbines 120, 124 can include a plurality of turbine stages, each stage including both an annular array of stationary nozzle vanes and an annular array of rotating turbine blades positioned immediately downstream of the nozzle vanes.

Additionally, as shown in FIG. 1, the fan section 108 of the engine 102 can generally include the rotatable, axial-flow fan rotor assembly 130 that is configured to be surrounded by the annular fan casing 132. The fan casing 132 can be configured to be supported relative to the core gas turbine engine 106 by the plurality of substantially radially-extending, circumferentially-spaced outlet guide vanes 134. As such, the fan casing 132 can enclose the fan rotor assembly 130 and its corresponding fan rotor blades 136. Moreover, the downstream section 138 of the fan casing 132 can extend over an outer portion of the core gas turbine engine 106 to define the secondary, or by-pass, airflow conduit 140 that provides additional propulsive jet thrust. A detailed example of the fan rotor blades 136 is further described below in conjunction with FIG. 2.

In some examples, the second (low-pressure) drive shaft 126 is directly coupled to the fan rotor assembly 130 to provide a direct-drive configuration. Alternatively, the second drive shaft 126 can be coupled to the fan rotor assembly 130 via the speed reduction device 142 (e.g., a reduction gear or gearbox) to provide an indirect-drive or geared drive configuration. Such a speed reduction device(s) can also be provided between any other suitable shafts and/or spools within the engine 102 as desired or required.

During operation of the engine 102, an initial air flow (indicated by arrow 148) can enter the engine 102 through the associated inlet 150 of the fan casing 132. The air flow 148 then passes through the fan blades 136 and splits into a first compressed air flow (indicated by arrow 152) that moves through conduit 140 and a second compressed air flow (indicated by arrow 154) which enters the booster compressor 114. The pressure of the second compressed air flow 154 is then increased and enters the high-pressure compressor 116 (as indicated by arrow 156). After mixing with fuel and being combusted within the combustor 118, the combustion products 158 exit the combustor 118 and flow through the first turbine 120. Thereafter, the combustion products 158 flow through the second turbine 124 and exit the exhaust nozzle 128 to provide thrust for the engine 102.

Figure 2:
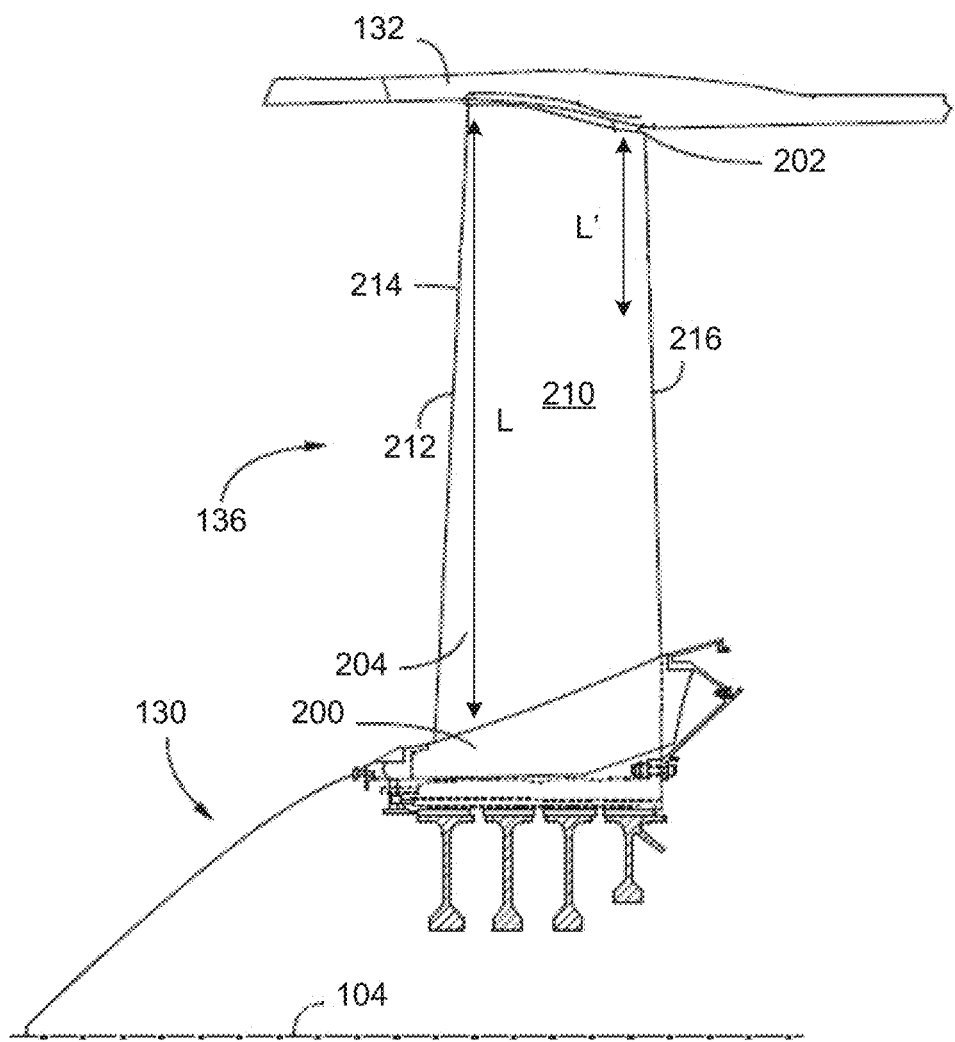
FIG. 2 is an example implementation of the fan blade of FIG. 1.

FIG. 2 illustrates an example implementation of the example fan rotor assembly 130 including one of the example fan blades 136 of FIG. 1. FIG. 2 includes the example axial centerline axis 104, the example fan rotor assembly 130, the example fan casing 132, and the example fan rotor blades 136 of FIG. 1. FIG. 2 further includes an example root 200, an example tip 202, an example exterior body 204, an example first side 210, an example second side 212, an example first edge 214, and an example second edge 216.

The fan blade 136 of FIG. 2 radially extends from the root 200 to the tip 202 and defines a length L. The exterior body 204 is the exterior of the fan blade 136 that radially extends from the root 200 to the tip 202. The exterior body 204 is made of a first material (e.g., a metal (e.g., Titanium, Aluminium, Steel, Inconel alloys, ferrous based alloys, copper based alloys, etc.), a composite material (e.g., reinforced plastics, fiberglass, metal matrix composites, carbon and/or glass reinforced polymers, etc.), and a combination thereof). In some examples, the exterior body 204 can be made of different materials in different directions (e.g., radial and/or axial). For example, the example exterior body 204 near the tip 202 can be made of a first material and the exterior body 204 near the root 200 can be made of a second material. The example exterior body 204 can be any shape and/or thickness. Additionally, each fan blade 136 includes a first side 210 (e.g., a pressure side), a second side 212 (e.g., a suction side), a first edge 214 (e.g., a leading edge) and a second edge 216 (e.g., a trailing edge). The example sides 210, 212 and edges 214, 216 can be made of the same material and/or different materials. The interior of the exterior body 204 can be filled with hairpin structures, air, super elastic material (e.g., nickel-titanium (NiTi) and/or alloys such as nickel-titanium hydrogen fluoride (NiTiHf), nickel-titanium palladium (NiTiPd), NiTi Hafnium (NiTiHf), NiTi Platinum (NiTiPt), NiTi Copper (NiTiCu), NiTi niobium (NiTiNb), NiTi vanadium (NiTiVd), TiNb, Copper Aluminium Beryllium (CuAlBe), Cu zinc (Zn) Al, etc.), and/or metal (e.g., Titanium, Aluminium, Steel, Inconel alloys, ferrous based alloys, copper based alloys, etc.), and/or metal (e.g., Titanium, Aluminium, Steel, Inconel alloys, ferrous based alloys, copper based alloys, etc.) to provide shock absorption and/or vibration damping, as further described below in conjunction with FIGS. 3-6.

The fan casing 132 of FIG. 2 is configured to channel the incoming air through the fan rotor assembly 130 to help ensure that the fan rotor assembly 130 compresses the bulk of the air entering the engine 102. By way of example and not limitation, the fan casing 132 can be made of the following: a metal (e.g., Titanium, Aluminium, Steel, Inconel alloys, ferrous based alloys, copper based alloys, etc.), a composite material (e.g., reinforced plastics, fiberglass, metal matrix composites, carbon and/or glass reinforced polymers, etc.), and a combination thereof.

Figure 3:
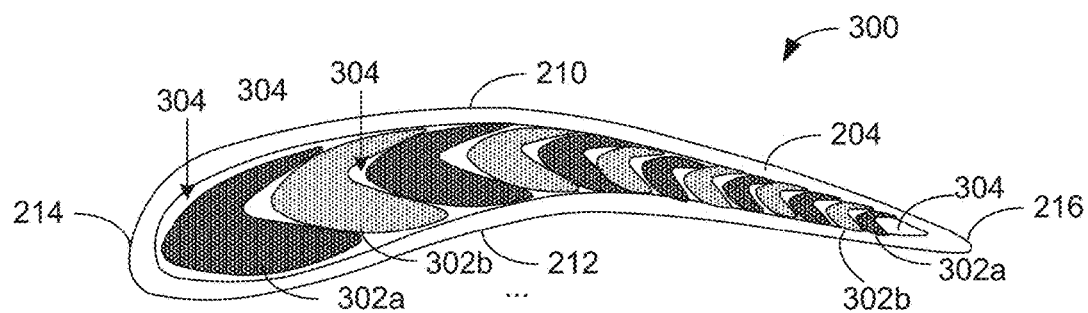
FIG. 3 is cross sectional view of an example implementation of the fan blade of FIGS. 1 and/or 2.

FIG. 3 illustrates an example cross sectional view 300 of a portion of the example fan blade 136 of FIGS. 1 and/or 2. The example cross sectional view 300 of the fan blade 136 includes the example exterior body 204 including the example sides 210, 212, and the example edges 214, 216 of FIG. 2. The example cross sectional view 300 further includes first example hairpin structures 302a, second example hairpin structures 302b, an example air and/or super elastic material cavity 304. Although the example cross section view 300 is described in conjunction with the example fan blade 136 of FIGS. 1 and/or 2, the cross section view 300 can implemented in any type of fan and/or blade.

The example hairpin structures 302a, 302b of FIG. 3 are "U", "V", and/or "C" shaped structures that extend radially within the exterior body 204 of the fan blade 136. In some examples, the hairpin structures 302a, 302b extend from the root 200 to the tip 202 (e.g., with a height equal to or approximately equal to (e.g., within a defined percentage (e.g., 10%) of) length L of FIG. 2). In some examples, the hairpin structures 302a, 302b radially extend within one or more radial section(s) (e.g., corresponding to region L' of FIG. 2). For example, if there is more than a threshold amount of vibration and/or energy corresponding to a shock event (e.g., based on test, simulations, regulations, etc.) in only the region corresponding region L', the example hairpin structures 302a, 302b can be implemented within the exterior body 204 for the radial area of the fan blade 136 corresponding to region L'. The remaining regions (e.g., the regions of the example fan blade 136 that do not result in more than a threshold amount of energy corresponding to a shock event, can be filled with a metallic material, a composite material, a super elastic material, and/or air (e.g., as an air cavity).

The example hairpin structures 302a, 302b of FIG. 3 is made from a variable material. For example, the hairpin structures 302a, 302b can be made from carbon nanotubes (CNT) impregnated with graphene, functionally graded material (FGM), metal, shape-memory alloy (SMA), etc. The variable material can be selected and/or generated based on a desired amount of stiffness. A higher stiffness material absorbs shock from high impact events, absorbs vibrations, and have higher strength, while a lower stiffness material provides a damping effect. Additionally or alternatively, the example hairpin structures 302a, 302b can be made with any kind of metallic material, a composite material, and a combination thereof. In the example of FIG. 3, the first hairpin structures 302a correspond to a higher stiffness and the second hairpin structures 302b correspond to a lower stiffness. However, the example hairpin structures 302a, 302b can have the same stiffness (e.g., composed on the same material). Additionally, although the example of FIG. 3 includes a particular number of hairpin structures 302a, 302b with particular characteristics (e.g., angle, orientation, dimensions (length, width, etc.), material, etc.) and/or a particular order or pattern (e.g., one hairpin structure 302a next to a second hairpin structure 302b, next to a subsequent hairpin structure 302a, etc.), the interior of the fan blade 136 can include any number and/or type of hairpin structures in any order and/or pattern.

The example hairpin structures 302a, 302b of FIG. 3 are coupled to the interior wall of the exterior body 204. In some examples, the hairpin structures 302a, 302b are coupled to the interior wall of the exterior body 204 using fuse shears for high load events, as further described below in conjunction with FIG. 4. In the example of FIG. 3, the example hairpin structures 302a, 302b are in contact with each other (e.g., adjacent such that part(s) of a first side of the first hairpin structure 302a is in contact with part(s) of a second side of the second hairpin structure 302b), but are not coupled together. If in contact but not coupled, when energy impact, pressure, and/or vibration cause the example exterior body 204 to compress, expand, and/or otherwise adjust form, the first hairpin structure 302a and the second hairpin structure 302b can move with respect to one another (e.g., by expanding and/or compressing the hairpin structures 302a, 302b). Because the hairpin structures 302a, 302b are in contact and moving with respect of one another, the movement causes friction that to provide self-damping that absorbs energy and reduces stress propagation.

The example hairpin structures 302a, 302b of FIG. 3 are structured so that, there is a gap between the angled portions of the hairpin structures 302a, 302b. The gap can be left empty (e.g., corresponding to an air cavity) and/or can be filled with super elastic material (e.g., nickel-titanium and/or alloys such as NiTiHf, NiTiPd, NiTi, NiTiHf, NiTiPt, NiTiPd, NiTiCu, NiTiNb, NiTiVd, TiNb, CuAlBe, CuZnAl, etc.), thereby creating the example air and/or super elastic material cavity 304. The air and/or super elastic material cavity acts as a shock absorber for high impact events. Any area within the exterior body 204 that is not filled by the example hairpin structures 302a, 302b can be filled by air and/or super elastic material, thereby also corresponding to the air and/or super elastic material cavity 304.

Figure 4:
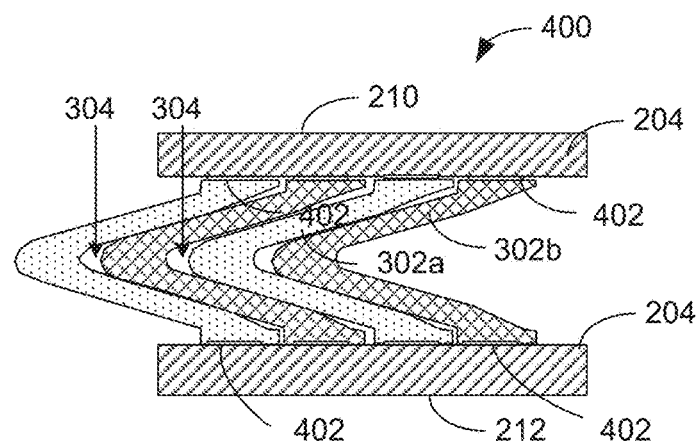
FIG. 4 is cross sectional view of an example implementation of the fan blade of FIGS. 1 and/or 2.

FIG. 4 illustrates an alternative example cross sectional view 400 of a portion of the example fan blade 136 of FIGS. 1 and/or 2. The example cross sectional view 400 of the fan blade 136 includes the example exterior body 204 including the example sides 210, 212, the example hairpin structures 302a, 302b, and the example air and/or super elastic material cavity 304 of FIGS. 2 and/or 3. The example cross sectional view 400 further includes example fuses 402. Although the example cross section view 400 is described in conjunction with the example fan blade 136 of FIGS. 1 and/or 2, the cross section view 400 can implemented in any type of fan and/or blade.

The example fuses 402 of FIG. 4 couple the example hairpin structures 302a, 302b to the interior part of the example exterior body 204. In some examples, the fuses 402 are shear fuses. Shear fuses shear off (e.g., break) when more than a threshold amount of energy and/or load is applied to the fan blade 136. In this manner, the example hairpin structures 302a, 302b can move with respect to the interior wall of the exterior body 204 (e.g., laterally), thereby creating additional friction to absorb more energy. The example shear fuses 402 can be created with weak diffusion bonding (e.g., by adding porosity to the fuse to make the fuse weaker). In some examples, some of the hairpin structures 302a, 302b can be fused with regular fuses, and some of the hairpin structures 302a, 302b can be fused with one or more types (e.g., corresponding to different strengths) of shear fuses.

Figure 5:
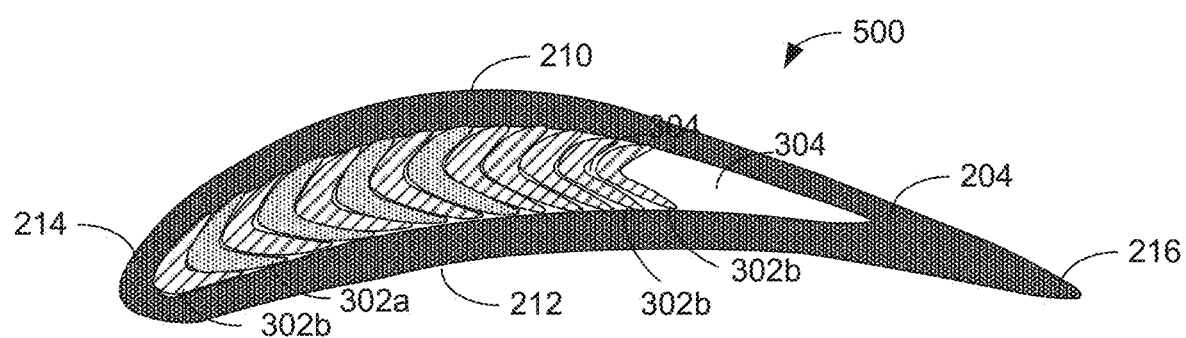
FIG. 5 is cross sectional view of an example implementation of the fan blade of FIGS. 1 and/or 2.

FIG. 5 illustrates an alternative example cross sectional view 500 of a portion of the example fan blade 136 of FIGS. 1 and/or 2. The example cross sectional view 500 of the fan blade 136 includes the example exterior body 204 including the example sides 210, 212 and the example edges 214, 216, the example hairpin structures 302a, 302b, and the example air and/or super elastic material cavity 304 of FIGS. 2 and/or 3. Although the example cross section view 500 is described in conjunction with the example fan blade 136 of FIGS. 1 and/or 2, the cross section view 500 can be implemented in any type of fan and/or blade.

The example cross sectional view 500 of FIG. 5 includes an alternative hairpin structure pattern. For example, a first section (e.g., nearest the edge 214) includes the example hairpin structure 302a, followed by the hairpin structure 302b, followed by the hairpin structure 302a, etc. A second section (e.g., in the middle, between the edges 214, 216) includes the example hairpin structures 302a without the hairpin structures 302b. A third section (e.g., nearest the edge 216) corresponds to the example air and/or super elastic material cavity 304. The example structure of the cross sectional view 500 of FIG. 5 can be used when, for example, the second section requires (e.g., based on test results and/or regulations) additional strength and the third section requires additional shock absorption for high impact events. However, although the example of FIG. 5 includes a particular number of hairpin structures 302a, 302b in a particular structure (e.g., angle, orientation, dimensions (length, width, etc.), material, etc.) and/or particular order or patterns, the interior of the fan blade 136 can include any number and/or type of hairpin structures in any one or more structures according to any order and/or pattern.

Figure 6:
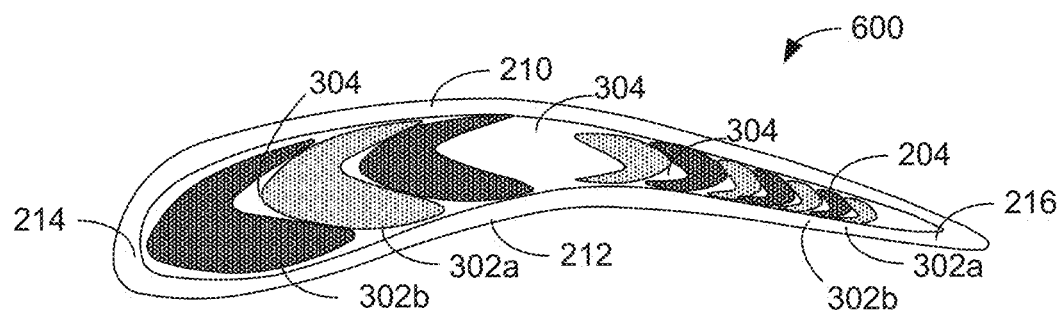
FIG. 6 is cross sectional view of an example implementation of the fan blade of FIGS. 1 and/or 2.

FIG. 6 illustrates an alternative example cross sectional view 600 of a portion of the example fan blade 136 of FIGS. 1 and/or 2. The example cross sectional view 600 of the fan blade 136 includes the example exterior body 204 including the example sides 210, 212 and the example edges 214, 216, the example hairpin structures 302a, 302b, and the example air and/or super elastic material cavity 304 of FIGS. 2 and/or 3. Although the example cross section view 600 is described in conjunction with the example fan blade 136 of FIGS. 1 and/or 2, the cross section view 600 can be implemented in any type of fan and/or blade.

The example cross sectional view 600 of FIG. 6 includes an alternative hairpin structure pattern. For example, a first section (e.g., nearest the edge 214) includes the example hairpin structure 302a, followed by the hairpin structure 302b, followed by the hairpin structure 302a, etc., in a first orientation. A second section (e.g., in the middle, between the edges 214, 216) corresponds to the example air and/or super elastic material cavity 304. A third section (e.g., nearest the edge 216) includes the hairpin pattern of the first section in a second orientation opposite the first orientation. The example structure of the cross sectional view 500 of FIG. 5 can be used when, for example, the second section requires additional shock absorption for high impact events. However, although the example of FIG. 6 includes a particular number of hairpin structures 302a, 302b with particular characteristics (e.g., angle, orientation, dimensions (length, width, etc.), material, etc.) and/or particular order or patterns, the interior of the fan blade 136 can include any number and/or type of hairpin structures in any one or more structures according to any order and/or pattern.

Figure 7:
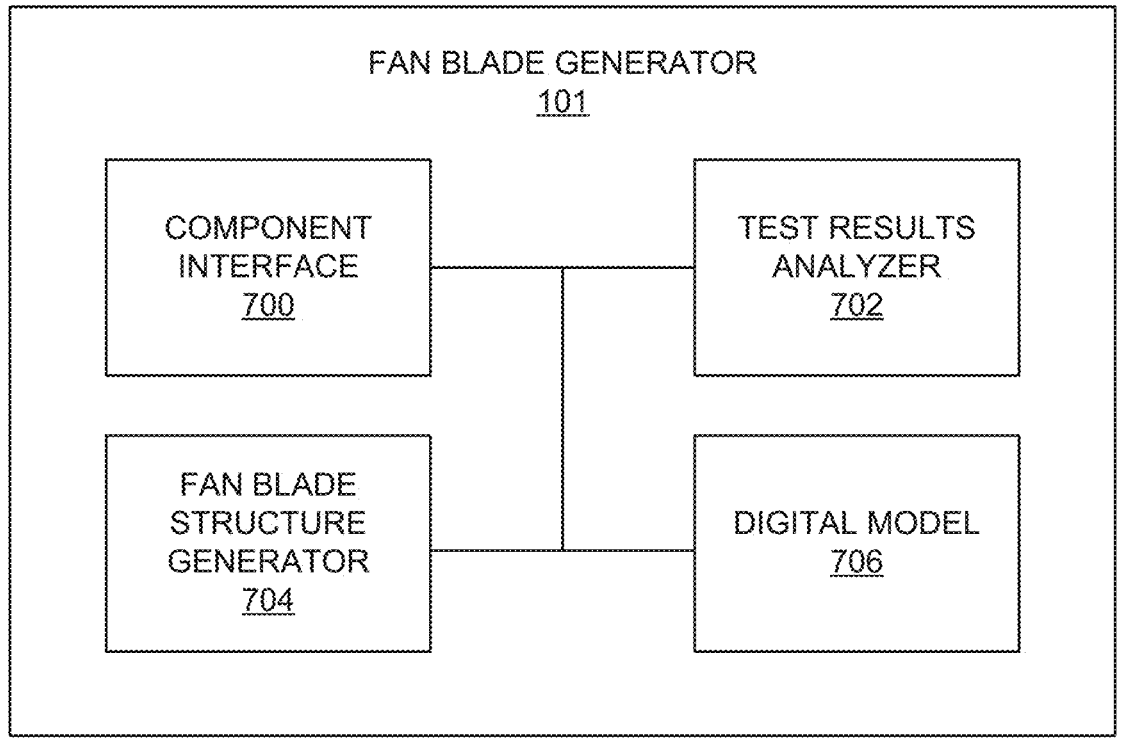
FIG. 7 is a block diagram of an example implementation of the example fan blade generator of FIG. 1.

FIG. 7 is a block diagram of an example implementation of the example fan blade generator 101 of FIG. 1. The example fan blade generator 101 of FIG. 7 includes an example component interface 700, an example test results analyzer 702, an example fan blade structure generator 704, and an example digital model 706.

The example component interface 700 of FIG. 7 interfaces with components of the gas turbine engine generator 100. For example, the component interface 700 can obtain test results and/or regulation instructions corresponding to the structure of the fan blade 136. Additionally, once a final structure of the fan blade 136 is complete, the component interface 700 can output the structure to the example gas turbine engine generator 100, so that the gas turbine engine generator 100 can manufacture the fan blade 136 according to the final structure design.

The example test results analyzer 702 of FIG. 7 analyzes obtained test results and/or regulation instructions to identify parts of the fan blade 136 that may need additional vibration damping, shock absorption, and/or strength. For example, the test results analyzer 702 can determine if test results correspond to more than weaknesses, more than a threshold amount of vibration and/or shock energy. In some examples, the test results analyzer 702 can determine that additional vibration damping, shock absorption, strength is needed in one or more areas of the fan blade 136 based regulations.

The example fan blade structure generator 704 creates one or more hollow areas of the fan blade 136 based on the areas that the test results analyzer 702 identified as benefitting from additional vibration damping and/or shock absorption. Additionally, the example fan blade structure generator 704 generates and/or adjust the structure of the fan blade 136 based on the test results and/or regulations. For example, the fan blade structure generator 704 can include low stiff hairpin structures 302b for additional vibration damping or can include high stiff hairpin structures 302a and/or additional air and/or elastic material for fan blades 136 to provide additional shock protection. In some examples, the test results analyzer 702 adjusts an initial and/or intermediate design based on results from the digital model 706 that has performed a test with the initial and/or intermediate design. For example, if a test based on the initial and/or intermediate design results in a strength that is below a threshold amount of strength, the test results analyzer 702 can replace one or more low stiffness hairpins structures 302b with high stiffness hairpin structures 304b and/or can add additional hairpin structures 302a, 302b where the example air and/or super elastic cavity was in the previous structure to increase the strength fan blade 136.

The example digital model 706 of FIG. 7 is a digital model of a fan blade design that can be virtually tested based on real world conditions to determine the response of a fan blade structure (e.g., strength, vibration, shock, etc.). For example, the digital model 706 can be a digital twin model of the engine 102 that can simulate a virtually generated fan blade 136 in the engine 102 for a specified number of flight cycles. As used herein, the term "flight cycle" refers to a complete operation cycle of an aircraft flight executed by an asset including a take-off operation and a landing operation.

As used herein, the term "digital twin" refers to a digital representation, a digital model, or a digital "shadow" corresponding to a digital informational construct about a physical system. That is, digital information can be implemented as a "twin" of a physical device/system (e.g., the engine 102, etc.) and information associated with and/or embedded within the physical device/system. The digital model 706 can be linked with the physical system through the lifecycle of the physical system. In certain examples, the digital model 706 includes a physical object in real space, a digital twin of that physical object that exists in a virtual space, and information linking the physical object with its digital twin. The digital model 706 exists in a virtual space corresponding to a real space and includes a link for data flow from real space to virtual space as well as a link for information flow from virtual space to real space and virtual sub-spaces.

Once the fan blade 136 is designed, the example gas turbine engine generator 100 generates the fan blade based on the design. For example, the example gas turbine engine generator 100 can generate the exterior of the fan blade 136 with a metal, a composite material, and/or a combination thereof, leaving sections for the hairpin structures of the fan blade design hallow and leaving the hollow sections open on part of the exterior wall so that the hairpin structures can be placed within the exterior wall. The example gas turbine engine generator 100 can then generate (e.g., three-dimensional (3D) print) the hairpin structures of the fan blade design according to the fan blade plan. Once generated, the example gas turbine engine generator 110 places the structures according to the hairpin structure pattern into the corresponding hollow section(s) of the fan blade. The example gas turbine engine generator 110 can fuse the hairpin structures using regular fuses and/or fuse shears and complete the exterior wall of the fan blade to generate any one of the example fan blade 136 shown in FIGS. 1-6. Additionally, the example gas turbine engine generator 110 can attach the fan blade 136 to the rest of the generated engine 102 (e.g., the example axial-flow fan rotor assembly 130 of the engine 102).

While an example manner of implementing the example fan blade generator 101 of FIG. 1 is illustrated in FIG. 7, one or more of the elements, processes and/or devices illustrated in FIG. 7 may be combined, divided, re-arranged, omitted, eliminated and/or implemented in any other way. Further, the example component interface 700, the example test results analyzer 702, the example fan blade structure generator 704, the example digital model 706, and/or, more generally, the example fan blade generator 101 of FIG. 7 and/or the gas turbine engine generator 100 of FIG. 1 may be implemented by hardware, software, firmware and/or any combination of hardware, software and/or firmware. Thus, for example, any of the example component interface 700, the example test results analyzer 702, the example fan blade structure generator 704, the example digital model 706, and/or, more generally, the example fan blade generator 101 of FIG. 7 and/or the gas turbine engine generator 100 of FIG. 1 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example component interface 700, the example test results analyzer 702, the example fan blade structure generator 704, the example digital model 706, and/or, more generally, the example fan blade generator 101 of FIG. 7 and/or the gas turbine engine generator 100 of FIG. 1 is/are hereby expressly defined to include a non-transitory computer readable storage device or storage disk such as a memory, a digital versatile disk (DVD), a compact disk (CD), a Blu-ray disk, etc. including the software and/or firmware. Further still, the example fan blade generator 101 of FIG. 7 and/or the gas turbine engine generator 100 of FIG. 1 may include one or more elements, processes and/or devices in addition to, or instead of, those illustrated in FIGS. 1 and/or 7, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 8A:
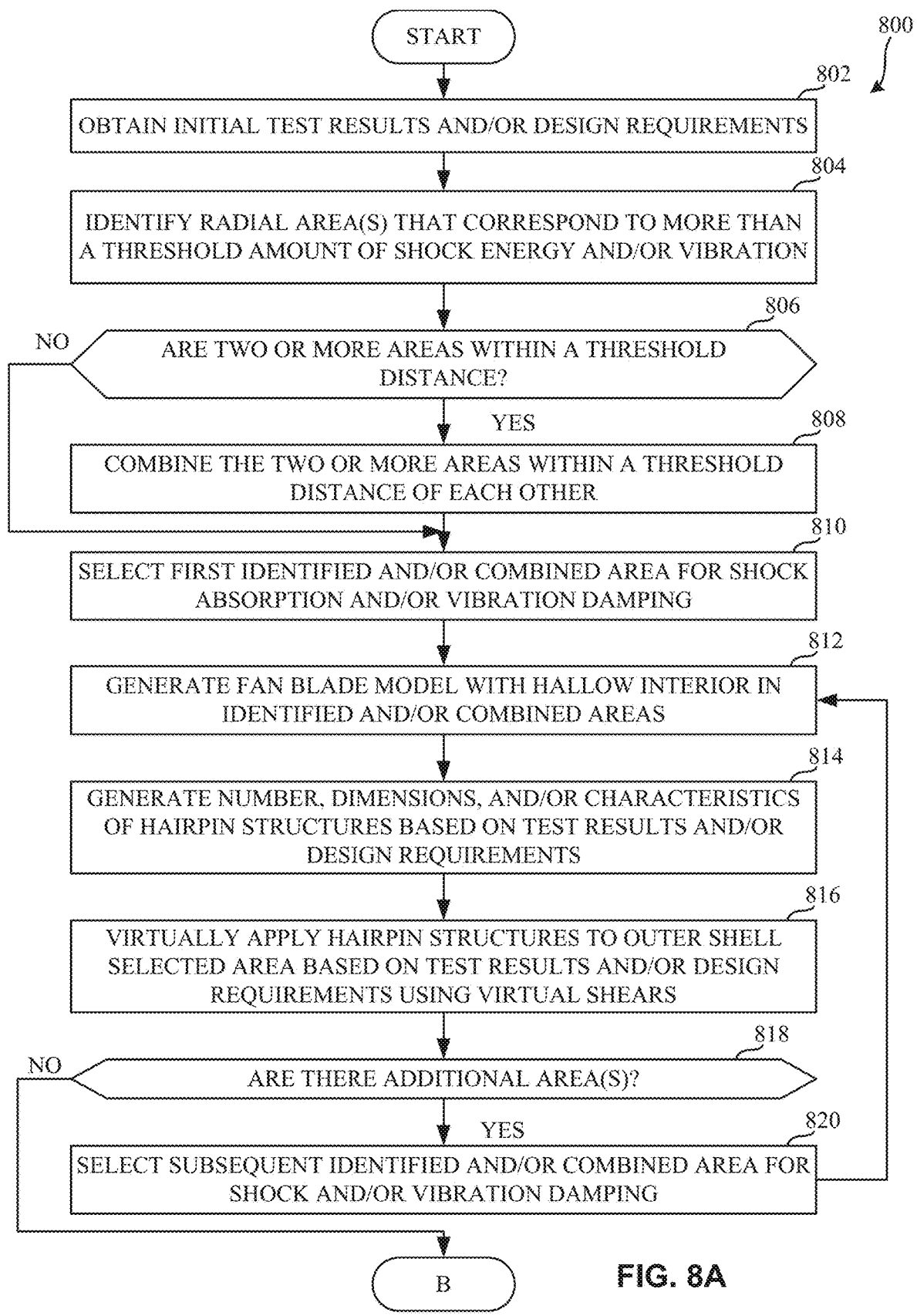
FIGS. 8A-8B illustrate a flowchart representative of example machine readable instructions which may be executed to implement the example fan blade generator of FIGS. 1 and/or 7 to generate a fan blade design in accordance with teachings of this disclosure.
Figure 8B:
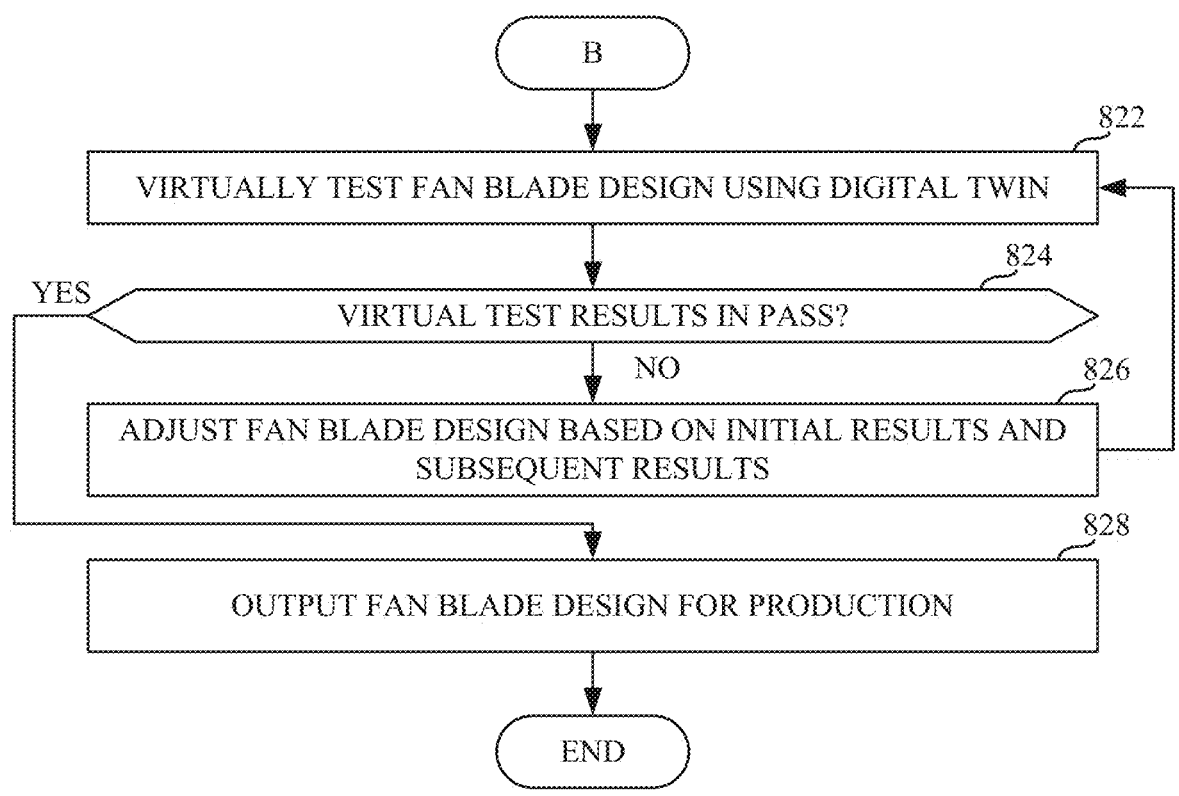
Figure 9:
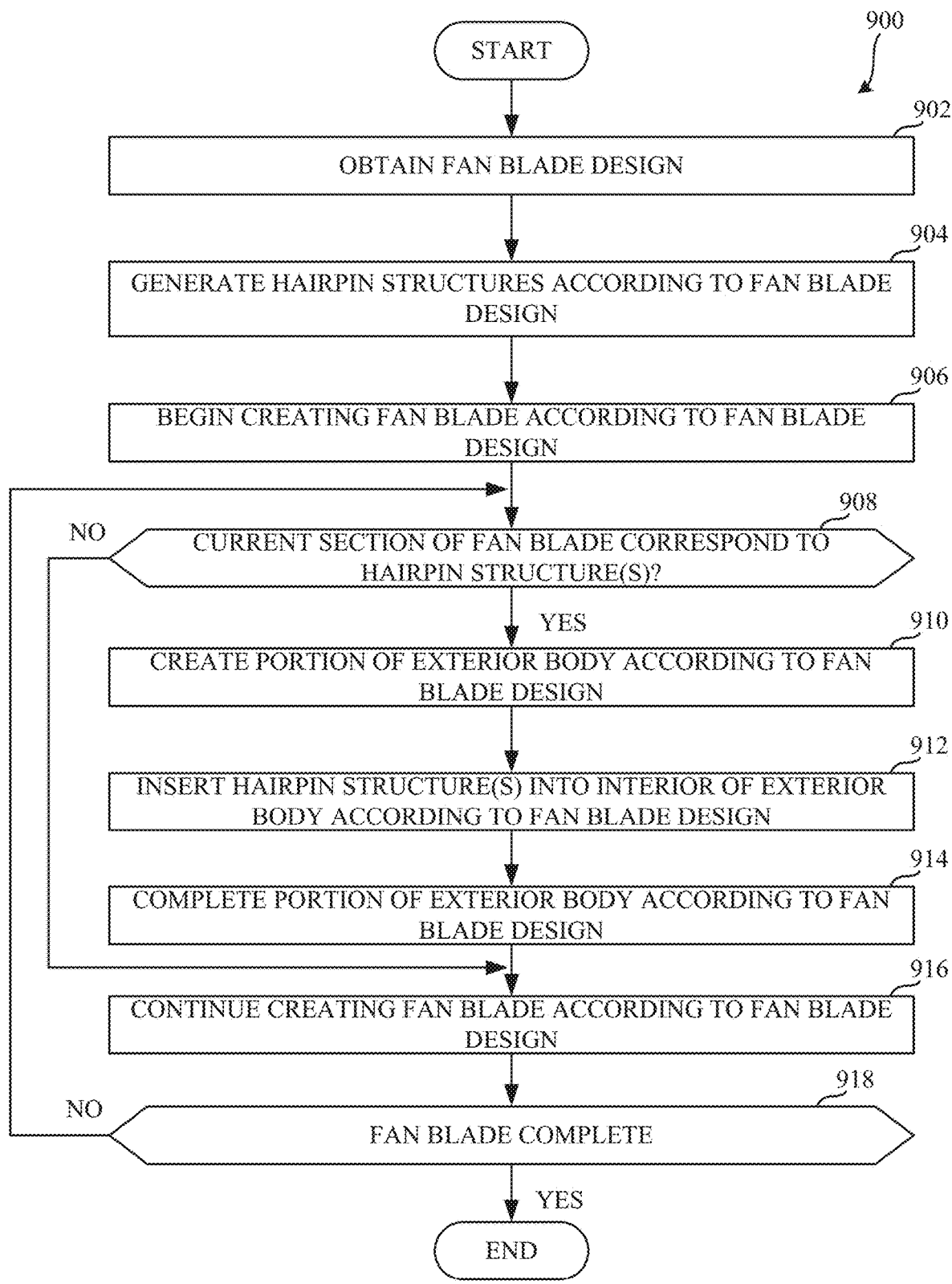
FIG. 9 illustrate a flowchart representative of example machine readable instructions and/or a method of manufacture which may be executed to implement the example gas turbine engine generator of FIG. 1 to manufacture the fan blade in accordance with teaching of this disclosure.

A flowchart representative of example hardware logic, machine readable instructions, hardware implemented state machines, and/or any combination thereof for implementing the fan blade generator 101 of FIG. 7 and/or the gas turbine engine generator 100 of FIG. 1 is shown in FIGS. 8A, 8B, and 9. The machine readable instructions may be one or more executable programs or portion(s) of an executable program for execution by a computer processor such as the processor 1012 shown in the example processor platform 1000 discussed below in connection with FIG. 10. The program may be embodied in software stored on a non-transitory computer readable storage medium such as a CD-ROM, a floppy disk, a hard drive, a DVD, a Blu-ray disk, or a memory associated with the processor 1012, but the entire program and/or parts thereof could alternatively be executed by a device other than the processor 1012 and/or embodied in firmware or dedicated hardware. Further, although the example program is described with reference to the flowchart illustrated in FIGS. 8A, 8B, and 9, many other methods of implementing the example fan blade generator 101 and/or the gas turbine engine generator 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example processes of FIGS. 8A-8B may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIGS. 8A-8B include an example flowchart representative of machine readable instructions 800 that can be executed to implement the example fan blade generator 101 of FIG. 7 to generate a structure for the example fan blade 136 of FIGS. 1-2. The example instructions 800 of FIGS. 8A-8B are described in conjunction with the example blade 136 of the example engine 102. However, in other examples, the example instructions 800 can be executed in conjunction with any type of fan blade for any type of rotor and/or fan.

At block 802, the example component interface 700 obtains initial test results and/or design requirements. For example, the component interface 700 can obtain initial test results from the engine 102 in which vibration, shock energy, etc. was measured with respect to a fan blade. Additionally or alternatively, the component interface 700 can obtain design requirements that correspond to how much vibration damping, shock absorption, and/or strength is required for different regions of the fan blade 136. At block 804, the example test results analyzer 702 identifies the radial areas that correspond to more than a threshold amount of shock energy and/or vibration based on the test results and/or the design requirements. For example, if the test results correspond to more than a threshold amount of vibration occurring at an area between 7 and 10 inches from the root 200 (FIG. 2), the test results analyzer 702 identifies the radial area corresponding to 7 to 10 inches out from the root 200.

At block 806, the example fan blade structure generator 704 determines if two or more areas are within a threshold distance of each other. For example, if the test results analyzer 702 determines that there is more than a threshold amount of vibration in the 7-10 inch area and an 11-12 inch area (e.g., an area between 11 and 12 inches from the root 200), and the threshold distance is two inches, the test results analyzer 702 determines that the two areas are within the threshold distance. If the example fan blade structure generator 704 determines that two or more areas are not within the threshold distance of each other (block 806: NO), control continues to block 810. If the example fan blade structure generator 704 determines that two or more areas are within the threshold distance of each other (block 806: YES), the example fan blade structure generator 704 combines the two or more areas that are within the threshold distance of each other (block 808). In the above example, the fan blade structure generator 704 combines the 7-10 inch area with the 11-12 inch area to generate a 7-12 inch area.

At block 810, the example fan blade structure generator 704 selects a first identified and/or combined area for shock absorption and/or vibration damping. At block 812, the example fan blade structure generator 704 generates a fan blade model with one or more hollow interiors for the identified and/or combined areas.

At block 814, the example fan blade structure generator 704 generates a number of hairpin structures 302a, 302b, dimensions for the hairpin structures 302a, 302b, and/or a characteristics of the hairpin structures 302a, 302b (e.g., dimensions, stiffness, material, location, orientation, amount of touch between neighboring hairpin structures, an amount of gap between neighboring hairpin structures, etc.) based on the test results and/or design requirements. For example, the fan blade structure generator 704 can include more low stiff hairpin structures 302b that need additional vibration damping or can include more high stiff hairpin structures 302a and/or additional air and/or elastic material for fan blades 136 to provide additional shock protection. For example, if there is more than a threshold amount of vibration and/or if more damping for vibration is desired, more the hairpin structures 302a, 302b may be angled differently to provide more frictional surface contract for the vibration damping. If there is more than a threshold amount of load impact and/or if additional shock abruption is desired, the hairpin structure thickness and/or angle may be adjusted to provide more air and/or super elastic material cavity 304 within the fan blade 136 to provide higher shock abruptions. Additionally or alternatively, the fan blade 136 of FIG. 3 may be used to higher impact load on the leading edge as it is more capable of handling higher impact loads on the leading edge. Additionally or alternatively, the fan blades of FIGS. 5 and/or 6 may be used based on the mode shapes (e.g., like flex mode, torsion mode, and stripe mode) of the fan blade 136.

At block 816, the example model generator 706 virtually applies the hairpin structures to the inside wall(s) of the exterior body 204 (e.g., the hollow areas) of a digital representation of the fan blade 136 based on the test results and/or design requirements using virtual fuses (e.g., corresponding to the example fuses 402 of FIG. 4). In some examples, the virtual fuses can be fuse shears structured to break off with more than a threshold amount of energy occurs to increase the amount of energy damping. At block 818, the example fan blade structure generator 704 determines if there are additional hollow area(s) to structure (e.g., the hairpin structures 302a, 302b and hairpin pattern). If the example fan blade structure generator 704 determines that there is/are not additional areas to structure (block 818: NO), control continues to block 822. If the example fan blade structure generator 704 determines that there is/are additional hollow area(s) to structure (block 818: YES), the example fan blade structure generator 704 selects a subsequent identified and/or combined area for shock and/or vibration damping (block 820) and control returns to block 812.

At block 822, the example digital model 706 tests the fan blade design using a digital twin (e.g., a virtual implementation of the example engine 102). The test can correspond to different simulation flights and/or scenarios used to generate results corresponding to the vibration, energy, strength, etc., of the generated fan blade design. At block 826, the example test results analyzer 702 determines if the results of the virtual test corresponding to a passing results (e.g., if the vibration and/or energy seen by the virtual fan blade is below one or more thresholds and/or if the strength of the virtual fan blade is sufficient). If the example test results analyzer 702 determines that the virtual test did not result in a pass (block 824: NO), the example fan blade structure generator 704 adjusts the fan blade design based on the initial results (e.g., from block 802) and the subsequent results (block 826) and control returns to block 822 until the virtual test results do result in a passing result. If the example test results analyzer 702 determines that the virtual test resulted in a pass (block 824: YES), the example component interface 700 outputs the fan blade design to the example gas turbine engine generator 100 for production of the fan blade 136 in the engine 102 based on the fan blade design.

FIG. 9 includes an example flowchart representative of machine readable instructions and/or a method of manufacture 900 that can be executed to implement the example gas turbine engine generator 100 of FIG. 1 to manufacture a structure for the example fan blade 136 of FIGS. 1-2. The example instructions and/or method 900 of FIG. 9 is described in conjunction with the example blade 136 of the example engine 102. However, in other examples, the example instructions and/or method 900 can be executed in conjunction with any type of fan blade for any type of rotor and/or fan.

At block 902, the example gas turbine engine generator 100 obtains the fan blade design from the example fan blade generator 101 of FIGS. 1 and/or 7. At block 904, the example gas turbine engine generator 100 generates the hairpin structure(s) 302a, 302b according to the fan blade design. As described above, the fan blade design identifies a number, location of, dimensions, material, etc. of the hairpin structures 302a, 302b to be used in the fan blade 136. The example gas turbine engine generator 100 generates the hairpin elements using the elements and/or based on the characteristics according to the fan blade design.

At block 906, the example gas turbine engine generator 100 begins to create the fan blade 136 according to the fan blade design. As described above, sections of the fan blade 136 can be solid or can include hollow sections that are filled with the hairpin structures 302a, 302b and/or elastic material (e.g., corresponding to the air and/or super elastic material cavity 304). The example gas turbine engine generator 100 can create (e.g., manufacture) the fan blade 136 using casting, an additive, a mold, and/or a three-dimensional printing. The example gas turbine engine generator 100 can create the fan blade 136 using a composite or metal (e.g., titanium, steel, Inco, etc.), shape memory allow (e.g., nickel-titanium), a combination of composites and metals, etc. As the gas turbine engine generator 100 begins creating the fan blade 136, the gas turbine engine generator 100 determines if the current section of the fan blade 136 that is being create corresponds to one or more hairpin structures 302a, 302b based on the fan blade design (block 908).

If the example gas turbine engine generator 100 determines that the current section of the fan blade 136 does not correspond to hairpin structure(s) (block 908: NO), control continues to block 916. If the example gas turbine engine generator 100 determines that the current section of the fan blade 136 corresponds to hairpin structure(s) (block 908: YES), the gas turbine engine generator 100 creates a portion of the exterior body 204 according to the fan blade design (block 910), thereby leaving a hollow interior to place the hairpin structures 302a, 302b into. At block 912, the example gas turbine engine generator 100 inserts the hairpin structure(s) 302a, 302b into the interior of the exterior body 204 according to the fan blade design. Additionally or alternatively, the gas turbine engine generator 100 may print the hairpin elements integrally in the fan blade structure through additive. In some examples, the gas turbine engine generator 100 additionally inserts and/or fills excess hollow space with super elastic material (e.g., based on the fan blade design). Additionally or alternatively, the gas turbine engine generator 100 can attach the hairpin structure(s) 302a, 302b to the interior wall of the exterior body 204 using shear fuses or other types of fuses (e.g., based on the fan blade design).

At block 914, the example gas turbine engine generator 100 completes the portion of the outer shell according to the fan blade design so that the inserted hairpin structures 302a, 302b are enclosed in the fan blade 136. At block 916, the example gas turbine engine generator 100 continues creating (e.g., through casting, modeling, or adding, and/or printing) the fan blade 136 according to the fan blade design. At block 918, the example gas turbine engine generator 100 determines if the fan blade 136 is complete. If the example gas turbine engine generator 100 determines that the fan blade 136 is not complete (block 918: NO), control returns to block 908. If the example gas turbine engine generator 100 determines that the fan blade 136 is complete (block 918: YES), the process ends.

Figure 10:
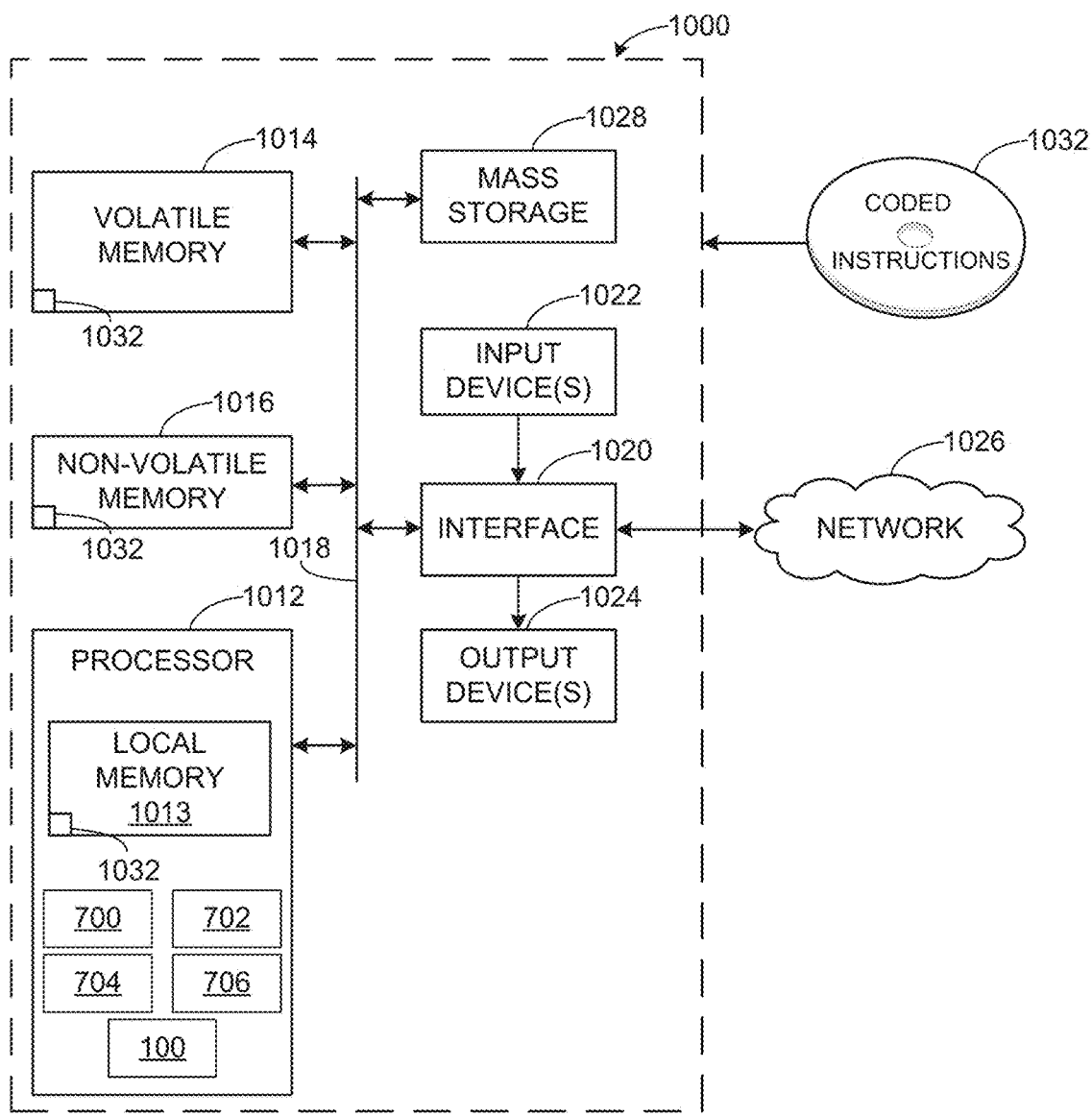
FIG. 10 is a block diagram of an example processing platform structured to execute the instructions of FIGS. 8A-8B and/or 9 to implement the example fan blade generator and/or the gas turbine engine generator of FIGS. 1 and/or 7.

FIG. 10 is a block diagram of an example processor platform 1000 structured to execute the instructions of FIGS. 8A-8B and/or 9 to implement the example fan blade generator 101 of FIG. 7. The processor platform 1000 can be, for example, a server, a personal computer, a workstation, a self-learning machine (e.g., a neural network), or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example gas turbine engine generator 100, the example component interface 700, the example test results analyzer 702, the example fan blade structure generator 704, and the example digital model 706.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), a Bluetooth® interface, a near field communication (NFC) interface, and/or a PCI express interface.

In the illustrated example, one or more input devices 1022 are connected to the interface circuit 1020. The input device(s) 1022 permit(s) a user to enter data and/or commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1020 of the illustrated example, thus, typically includes a graphics driver card, a graphics driver chip and/or a graphics driver processor.

The interface circuit 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1026. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, redundant array of independent disks (RAID) systems, and digital versatile disk (DVD) drives.

The machine executable instructions 1032 of FIGS. 8A, 8B, and/or 9 may be stored in the mass storage device 1028, in the volatile memory 1014, in the non-volatile memory 1016, and/or on a removable non-transitory computer readable storage medium such as a CD or DVD.

Further aspects of the invention are provided by the subject matter of the following clauses:

1. An apparatus for a fan blade comprising an exterior body including a first side and a second side, a first hairpin structure coupled to the first side of the exterior body and the second side of the exterior body, and a second hairpin structure coupled to the first side and the second side, the first hairpin structure in contact with the second hairpin structure.
2. The fan blade of any preceding clause wherein the first hairpin structure is at least one of a "U" shape, a "V" shape, or "C" shape.
3. The fan blade of any preceding clause wherein the first hairpin structure and the second hairpin structure are made from different materials.
4. The fan blade of any preceding clause wherein the first hairpin structure corresponds to a first stiffness and the second hairpin structure corresponds to a second stiffness different than the first stiffness.

5. The fan blade of any preceding clause wherein the first hairpin structure is coupled to the first side and the second side of the exterior body with fuse shears.

6. The fan blade of any preceding clause wherein the first hairpin structure is sandwiched with the second hairpin structure.

7. The fan blade of any preceding clause wherein there is at least one of an air cavity or an elastic material between the first hairpin structure and the second hairpin structure.

8. The fan blade of any preceding clause wherein the first hairpin structure and the second hairpin structure provides at least one of vibration damping or energy absorption.

9. The fan blade of any preceding clause wherein the first hairpin structure includes at least one of carbon nanotubes impregnated with graphene, functionally graded material, metal, or shape-memory alloy.

10. The fan blade of any preceding clause wherein the first hairpin structure extends radially from a first position of the fan blade to a second position of the fan blade.

11. The fan blade of any preceding clause wherein, when the first side of the exterior body and the second side of the exterior body compress together, the first hairpin structure and the second hairpin structure rub against each other.

12. A turbine engine comprising a compressor, a turbine, and a rotor including a fan blade, the fan blade including a first hairpin structure coupled to a first side of a first interior wall of the fan blade and a second side of a second interior wall of the fan blade.

13. The turbine engine of any preceding clause wherein the fan blade includes a second hairpin structure coupled to the first side of the first interior wall of the fan blade and the second side of the second interior wall of the fan blade.

14. The turbine engine of any preceding clause wherein, when a first side of the first interior wall and a second side of the second interior wall compress together, the first hairpin structure and the second hairpin structure rub against each other.

15. A method comprising generating a design of a fan blade to include a first hairpin structure and a second hairpin structure, the first hairpin structure and the second hairpin structure corresponding to test results, fusing the first hairpin structure to a first interior side and a second interior side of the fan blade, the first hairpin structure and the second hairpin structure touching within an interior of the fan blade, and attaching the fan blade to a rotor.

16. The method of any preceding clause further including determining characteristics of the first hairpin structure based on the test results.

17. The method of any preceding clause wherein the characteristics corresponds to at least one of dimensions of the first hairpin structure, material of the first hairpin structure, shape of the first hairpin structure, angle of the first hairpin structure, or orientation of the first hairpin structure.

18. The method of any preceding clause further including generating a virtual model of the fan blade, testing the virtual model of the fan blade, and adjusting the design based on the testing of the virtual model 19 includes the method of example 15, further including selecting a first stiffness for the first hairpin structure for shock absorption and selecting a second stiffness for the second hairpin structure.

20. The method of any preceding clause wherein the first hairpin structure extends radially through the fan blade.

From the foregoing, it will be appreciated that example methods, apparatus and articles of manufacture have been disclosed that generate a fan blade with intrinsic damping characteristics. The disclosed fan blade provides vibration damping and/or energy absorption for a lighter fan blade than conventional fan blades. The disclosed fan blade can be customized for fans that experience particular energy and/or vibrations to optimize and/or improve the strength and/or durability of an engine that implements the fan blade.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. A fan blade comprising:
an exterior body including a first side and a second side;
a first hairpin structure in contact with (a) the first side of the exterior body and (b) the second side of the exterior body; and
a second hairpin structure in contact with (a) the first side, (b) the second side, and (c) the first hairpin structure.

2. The fan blade of claim 1, wherein the first hairpin structure is at least one of a "U" shape, a "V" shape, or a "C" shape.

3. The fan blade of claim 1, wherein the first hairpin structure and the second hairpin structure are made from different materials.

4. The fan blade of claim 1, wherein the first hairpin structure is in contact with the first side and the second side of the exterior body via fuse shears.

5. The fan blade of claim 1, wherein the first hairpin structure is sandwiched with the second hairpin structure.

6. The fan blade of claim 1, wherein there is at least one of an air cavity or an elastic material between the first hairpin structure and the second hairpin structure, the at least one of the air cavity or the elastic material providing shock absorption.

7. The fan blade of claim 1, wherein the first hairpin structure and the second hairpin structure provides at least one of vibration damping or energy absorption.

8. The fan blade of claim 1, wherein the first hairpin structure includes at least one of carbon nanotubes impregnated with graphene, functionally graded material, metal, or shape-memory alloy.

9. The fan blade of claim 1, wherein the first hairpin structure extends radially from a first position of the fan blade to a second position of the fan blade.

10. The fan blade of claim 1, wherein, when the first side of the exterior body and the second side of the exterior body compress together, the first hairpin structure and the second hairpin structure rub against each other.

11. A turbine engine comprising:
a compressor;
a turbine; and
a rotor including a fan blade, the fan blade including a first hairpin structure in contact with (a) a first side of a first interior wall of the fan blade and (b) a second side of a second interior wall of the fan blade, wherein the fan blade includes a second hairpin structure in contact with the first side of the first interior wall of the fan blade, the second side of the second interior wall of the fan blade and (c) the first hairpin structure.

12. The turbine engine of claim 11, wherein, when the first side of the first interior wall and the second side of the second interior wall compress together, the first hairpin structure and the second hairpin structure rub against each other.

13. The turbine engine of claim 11, wherein the first hairpin structure is at least one of a "U" shape, a "V" shape, or a "C" shape.

14. The turbine engine of claim 11, wherein the first hairpin structure and the second hairpin structure are made from different materials.

* * * * *